United States Patent
Chen et al.

(10) Patent No.: US 8,051,899 B2
(45) Date of Patent: Nov. 8, 2011

(54) HEAT DISSIPATING MODULE AND HEAT SINK THEREOF

(75) Inventors: Chin-Ming Chen, Taoyuan Hsien (TW); Yu-Hung Huang, Taoyuan Hsien (TW); Yu-Hsien Lin, Taoyuan Hsien (TW)

(73) Assignee: Delta Electronics Inc., Taoyuan Hsien (TW)

( * ) Notice: Subject to any disclaimer, the term of this patent is extended or adjusted under 35 U.S.C. 154(b) by 0 days.

(21) Appl. No.: 11/979,807

(22) Filed: Nov. 8, 2007

(65) Prior Publication Data

US 2008/0130229 A1     Jun. 5, 2008

(30) Foreign Application Priority Data

Dec. 1, 2006    (TW) ................................ 95144578 A

(51) Int. Cl.
*F28D 15/00*    (2006.01)
*H05K 7/20*    (2006.01)

(52) U.S. Cl. ..................................... 165/104.34; 165/77

(58) Field of Classification Search .................. 361/697, 361/695; 165/104.33, 80.3, 185, 76–79, 165/121; 257/726–727, 718–719; 248/510; 24/457–458
See application file for complete search history.

(56) References Cited

U.S. PATENT DOCUMENTS

| | | | |
|---|---|---|---|
| 6,435,467 B1 * | 8/2002 | Lai | 248/500 |
| 2004/0000398 A1 * | 1/2004 | Lee et al. | 361/697 |
| 2005/0117306 A1 * | 6/2005 | Lee et al. | 361/719 |
| 2006/0056152 A1 * | 3/2006 | Li et al. | 361/697 |

FOREIGN PATENT DOCUMENTS

| | | | |
|---|---|---|---|
| CN | 02271720 | | 7/2003 |
| KR | 2003030350 A | * | 4/2003 |
| TW | 267523 | | 6/2005 |

* cited by examiner

*Primary Examiner* — Tho V Duong
(74) *Attorney, Agent, or Firm* — Birch, Stewart, Kolasch & Birch, LLP

(57) ABSTRACT

A heat dissipating module includes a fan and a heat sink. The heat sink comprises a body and at least one movable member. The body comprises a plurality of fins, at least one first slot and at least one second slot. The first and second slots are integrally formed on the body as a single piece. The movable member, rotatably or movably coupled to the first slot, comprises a pivoting portion, an operating portion, a jointing portion and at least one fixing portion. The pivoting portion is rotatably or movably received in the first slot. A first end of the operating portion connects to the pivoting portion, rotating or moving the pivoting portion. The jointing portion, at a second end of the operating portion, selectively connects to or separates from the second slot. The fixing portion protrudes from the pivoting portion, abutting and securing the fan to the heat sink.

21 Claims, 3 Drawing Sheets

HEAT DISSIPATING MODULE AND HEAT SINK THEREOF

BACKGROUND OF THE INVENTION

1. Field of the Invention

The invention relates to a heat dissipating module and heat sink thereof, and in particular, to a heat dissipating module and heat sink thereof with lower costs, a more stable structure, less manufacturing procedures and a more simplified assembly process.

2. Description of the Related Art

Central processing units (CPU) are continually being developed toward higher speeds, resulting in the problem of heat increase. If heat from the CPU is not dissipated timely, the lifetime of the CPU will decrease and CPU stability will be affected.

As a result, a heat sink is disposed on the top of the CPU, comprising a fan on the fins of the heat sink to rapidly dissipate heat produced by the CPU.

The conventional method for assembling the fan to the heat sink is by using screws. However, the method damages or deforms the fins of the heat sink, such that the screws are easily loosened due to the vibration of the fan. Thus, causing instability of fan attachment and decrease heat-dissipating efficiency.

Another method for securing the fan to the heat sink is by first securing the fan to a frame and then attaching the frame to the heat sink by welding, buckling, or tight fitting, as disclosed in Chinese patent application No. 02271720.X and TW patent publication No. M267523. However, such method requires an additional frame and two-phased connections, resulting in higher cost, increased manufacturing procedures, and a more complicated assembly process.

As described, the frame is welded, buckled or tightly fitted to the heat sink in a single direction. The fan vibrates in two-dimensional or three-dimensional directions, such that the frame is easily separated or loosened from the heat sink during the operation of the fan. Thus, like previous, the fan is not stably fixed on the heat sink, decreasing heat dissipating efficiency.

Most fans are secured to the heat sink or to fan frames by direct screwing. Additional methods must be utilized to assist in securing of the fan, resulting in a more complicated assembly process.

BRIEF SUMMARY OF THE INVENTION

The invention provides a heat dissipating module and a heat sink thereof which requires less manufacturing costs and processes.

The invention provides another heat dissipating module to increase the stability and simplify structure of the fan and the heat sink.

The invention provides a heat sink comprising a body and at least one movable member. The body comprises a plurality of fins, at least one first slot and at least one second slot, wherein the first and second slots are integrally formed on the body as a single piece. The movable member, rotatably or movably coupled to the first slot, comprises a pivoting portion, an operating portion, a jointing portion and at least one fixing portion. The pivoting portion is rotatably or movably received in the first slot. The operating portion comprises a first end and a second end. The first end of the operating portion connects to the pivoting portion for rotating or moving the pivoting portion. The jointing portion is at the second end of the operating portion for selectively connecting to or separating from the second slot. The fixing portion is protruded from the pivoting portion for abutting and securing a fan to the body.

The invention provides another heat sink comprising a body and at least one movable member. The body comprises a plurality of fins, at least one first slot and at least one second slot, wherein the first and second slots are integrally formed on the body as a single piece. The movable member, rotatably or movably coupled to the first slot, comprises a jointing portion and at least one fixing portion. The jointing portion, at an end of the movable member, selectively connects to or separates from the second slot. The fixing portion is protruded from the movable member for abutting and securing a fan to the body.

The invention provides yet another heat sink comprising a body and at least one movable member. The movable member comprises a first end rotatably or movably coupled to the body. The movable member comprises a jointing portion and at least one fixing portion. The jointing portion, at a second end of the movable member, selectively connects to or separates from the body. The fixing portion is protruded from the movable member for abutting and securing the fan to the body.

The invention provides a heat dissipating module comprising a fan and a heat sink. The heat sink comprises a body and at least one movable member. The body comprises a plurality of fins, at least one first slot and at least one second slot, wherein the first and second slots are integrally formed on the body as a single piece. The movable member, rotatably or movably coupled to the first slot, comprises a pivoting portion, an operating portion, a jointing portion and at least one fixing portion. The pivoting portion is rotatably or movably received in the first slot. The operating portion comprises a first end connecting to the pivoting portion for rotating or moving the pivoting portion. The jointing portion is at a second end of the operating portion for selectively connecting to or separating from the second slot. The fixing portion is protruded from the pivoting portion for abutting and securing a fan to the body.

The invention provides another heat dissipating module comprising a fan and a heat sink. The heat sink comprises a body and at least one movable member. The body comprises a plurality of fins, at least one first slot and at least one second slot, wherein the first and second slots are integrally formed on the body as a single piece. The movable member, rotatably or movably coupled to the first slot, comprises a jointing portion and at least one fixing portion. The jointing portion, at an end of the movable member, selectively connects to or separates from the second slot. The fixing portion is protruded from the movable member for abutting and securing a fan to the body.

The invention provides yet another heat dissipating module comprising a fan and a heat sink. The heat sink comprises a body and at least one movable member. The movable member comprises a first end rotatably or movably coupled to the body. The movable member comprises a jointing portion and at least one fixing portion. The jointing portion, at a second end of the movable member, selectively connects to or separates from the body. The fixing portion is protruded from the movable member for abutting and securing the fan to the body.

The heat dissipating module and the heat sink thereof comprises a rotating or moving portion to easily secure the fan to the heat sink. Additionally, because the movable member is directly secured to the body of the heat sink by rotating or moving, the complicated-precise-alignment process among the conventional fan, the frame, and the heat sink can be simplified. In addition, the frame can be eliminated, thus reducing manufacturing processes and assembly.

Further, the heat dissipating module and the heat sink do not require an additional frame, and manufacturing cost and material can further be saved. Moreover, because the movable member directly secures the fan to the heat sink, the fan can be secured in multiple directions, increasing the stability of the fan's attachment to the heat sink.

The movable member of the heat dissipating module and the heat sink thereof comprises a holding portion which easily rotates or moves the movable member, such that the fan can be secured to the heat sink easier.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
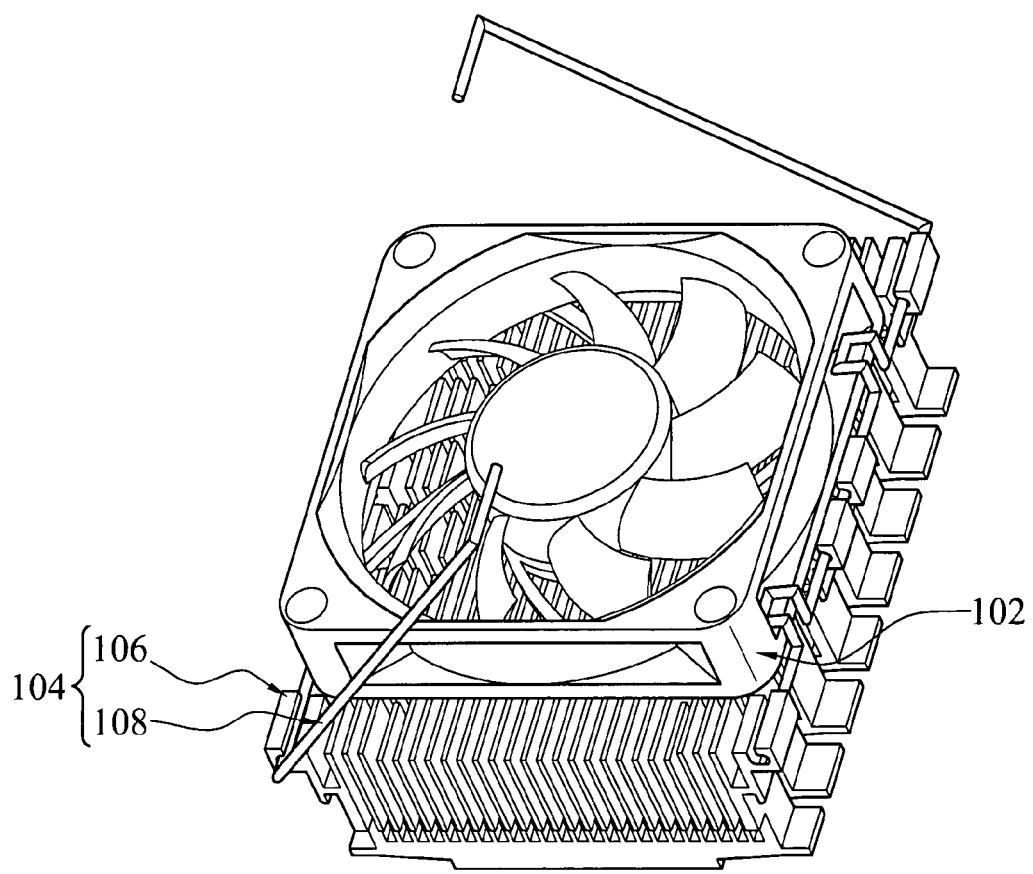
FIG. 1 is a schematic illustration of a first embodiment of a heat dissipating module.
Figure 2:
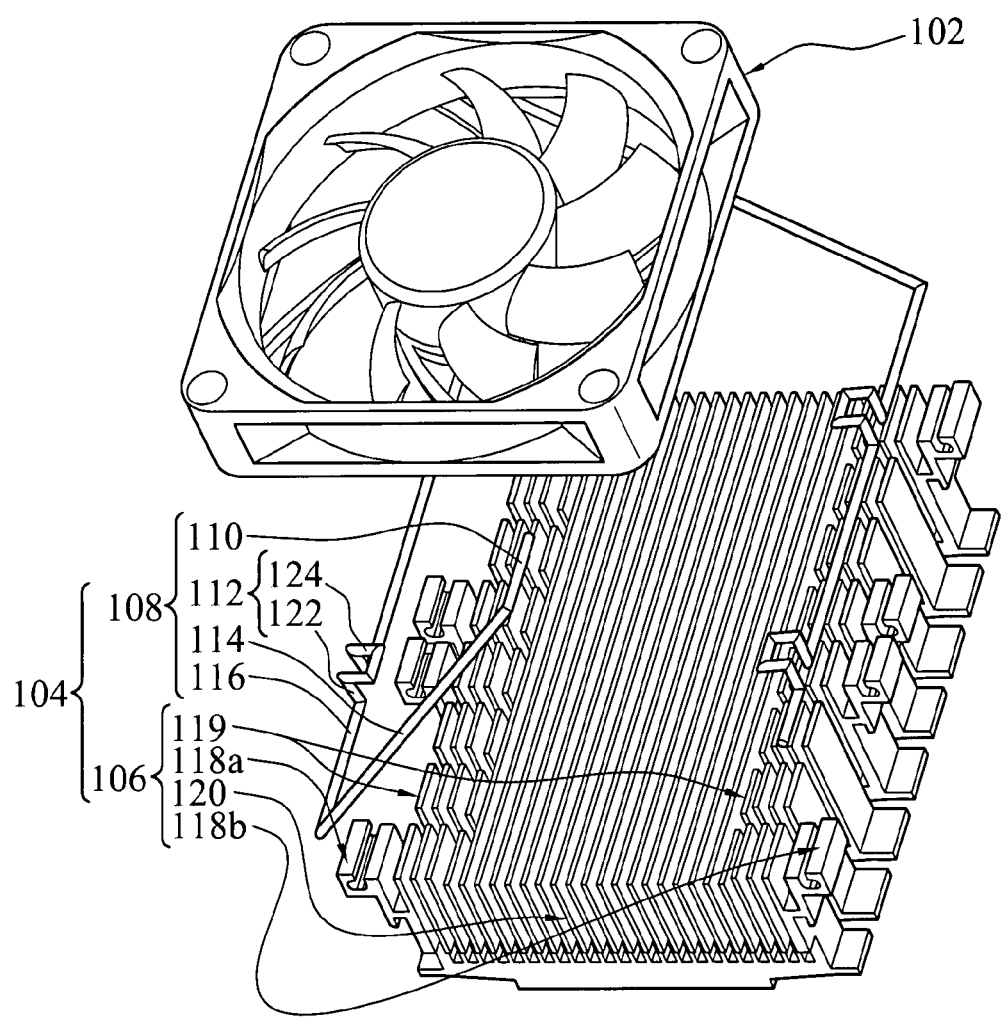
FIG. 2 is an exploded view of the heat dissipating module in FIG. 1.

FIG. 1 is a schematic illustration of a first embodiment showing a heat dissipating module 100. FIG. 2 is an exploded view of the heat dissipating module 100 in FIG. 1. Referring to FIGS. 1 and 2, the heat dissipating module 100 comprises at least one fan 102 and a heat sink 104. The fan 102 is an axial fan, a side-blowing fan or a diagonal-blowing fan.

The heat sink 104 comprises a body 106 and at least one movable member 108. The body 106 comprises a plurality of fins 120 for dissipating heat from an electrical component. The body 106 further comprises at least one first slot 118a and at least one second slot 118b, wherein the first slot 118a and the second slot 118b are integrally formed on the body 106 as a single piece. Specifically, the first slot 118a and the second slot 118b are integrally formed on different fins 120.

The body 106 further comprises a plate portion 119 for receiving the fan. The first slot 118a and the second slot 118b disposed on the body 106, surround the periphery of the plate portion 119.

The movable member 108 comprises a first end rotatably or movably connecting to the body 106. Specifically, the movable member 108 rotatably or movably connects to the first slot 118a. The movable member 108 comprises a second end forming a jointing portion 110 for selectively connecting to or separating from the second slot 118b of the body 106. The jointing portion 110 is linear, L-shaped, U-shaped or curved.

The movable member 108 comprises at least one fixing portion 112 protruding from the movable member 108 for abutting and securing the fan 102 to the body 106. Specifically, the fixing portion 112 abuts a side surface, corner or a base of the fan 102. The fixing portion 112 is a C-shaped structure, U-shaped structure, L-shaped structure, K-shaped structure or J-shaped structure.

The fixing portion 112 comprises at least one connecting portion 122 and at least one pressing portion 124. The pressing portion 124 connects to the connecting portion 122 and an angle is formed therebetween. An end of the connecting portion 122 connects to the movable member 108. The connecting portion 122 is linear or curved. The pressing portion 124 is U-shaped, linear or curved.

The movable member 108 further comprises a pivoting portion 116 rotatably or movably received in the first slot 118a. The fixing portion 112 is protruded from the pivoting portion 116, and connected to an end of the connecting portion 122. The pivoting portion 116 is linear or curved.

The movable member 108 further comprises an operating portion 114. A first end of the operating portion 114 connects to the pivoting portion 116 for rotating or movable the pivoting portion 116. A second end of the operating portion 114 connects to the jointing portion 110. The operating portion 114 and the pivoting portion 116 form an angle therebetween. The operating portion 114 is linear or curved.

The pivoting portion 116, the operating portion 114, and jointing portion 110 and the fixing portion 112 of the movable member 108 are integrally formed as a single piece. In particular, the movable member 108 is bent from a shaft-shaped structure, plate-shaped structure, a cubic structure or an integrally formed structure.

By rotating or moving the operating portion 114 of the heat dissipating module 100 and the heat sink 104, the fan 102 is easily secured to the heat sink 104. Because the movable member 114 is directly connected to the body 106 of the heat sink 104 by rotating or moving, the complicated-precise-alignment process among the conventional fan, the frame and the heat sink can be simplified. In addition, the frame can be eliminated, thus reducing manufacturing processes and assembly.

Further, the heat dissipating module 100 and the heat sink 104 do not require an additional frame, and manufacturing cost and material can thus be saved. Moreover, because the movable member 108 directly secures the fan 102 on the heat sink 104, the fan 102 can be secured in multiple directions, increasing the stability of the fan 102's attachment to the heat sink 104.

Figure 3:
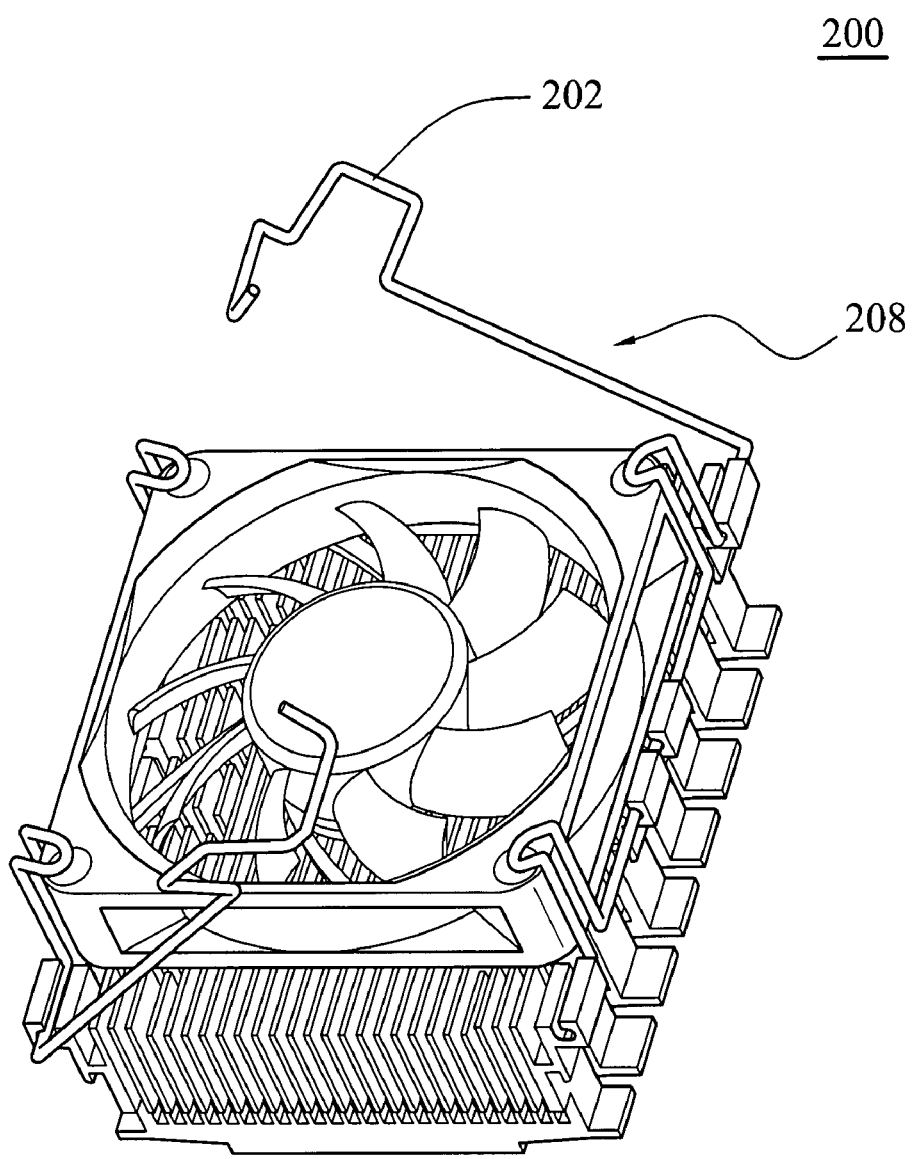
FIG. 3 is a schematic illustration of a second embodiment of a heat dissipating module.

FIG. 3 is a schematic illustration of another embodiment showing a heat dissipating module 200. The movable member 208 of the heat dissipating module 200 comprises at least one holding portion 202 to easily rotate or move the movable member 208. The holding portion 202 is a linear structure, a U-shaped structure, an N-shaped structure, an M-shaped structure, a curved structure, a plate-shaped structure or a structure with at least one bend.

In addition to the advantages described above, the movable member 208 of the heat dissipating module and the heat sink thereof comprises a holding portion 202, such that the movable member is rotated or moved easier and the fan is secured to the heat sink easier.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipating module, comprising:
   a fan; and
   a heat sink, comprising:
   a one-piece body comprising at least one first slot and at least one second slot extending in parallel with the first slot, wherein the first and second slots are respectively formed at two opposite edges of the one-piece body; and at least a movable member pivotally coupled to the one-piece body and comprising:
  at least one pivoting portion received in the first slot;
  a plurality of fixing portions, each of the plurality of fixing portions comprising at least one connecting portion connected with the pivoting portion and protruded from the pivoting portion of the movable member, and at least one pressing portion connected to the connecting portion, wherein the pressing portions are configured to detachably secure two corners of the fan to one of said two opposite edges of the one-piece body; and
  a jointing portion disposed at one end of the movable member, wherein when the movable member secures the fan on the one-piece body, the jointing portion is received in the second slot for fixing the movable member,
wherein two movable members are provided to fix the fan on the heat sink so that four corners of the fan are secured to said two opposite edges of the one-piece body respectively by the pressing portions of two movable members.

2. The heat dissipating module as claimed in claim 1, wherein the fixing portion abuts against a side surface, a corner or a base of the fan.

3. The heat dissipating module as claimed in claim 1, wherein the connecting portion and the pressing portion with an angle formed therebetween.

4. The heat dissipating module as claimed in claim 3, wherein the connecting portion is linear or curved, and the pressing portion is U-shaped, linear or curved.

5. The heat dissipating module as claimed in claim 1, wherein the fixing portion is a C shaped structure, a U shaped structure, an L shaped structure, a K shaped structure or a J shaped structure, and the jointing portion is linear, L-shaped, U-shaped or curved, and the movable member is a shaft shaped structure, a plate-shaped structure, a cubic structure or an integrally formed structure.

6. The heat dissipating module as claimed in claim 1, wherein the movable member further comprises a holding portion enabling a user to move the movable member.

7. The heat dissipating module as claimed in claim 6, wherein the holding portion is a linear structure, a U-shaped structure, a N-shaped structure, a M-shaped structure, a curved structure, a plate shaped structure with at least one bend.

8. The heat dissipating module as claimed in claim 1, wherein the one-piece body further comprises a plurality of fins, and the first and second slots are formed on the one-piece body as a single piece.

9. The heat dissipating module as claimed in claim 8, wherein the one-piece body further comprises a plate portion receiving the fan, the first and second slots surrounding a periphery of the plate portion are disposed on the one-piece body.

10. The heat dissipating module as claimed in claim 1, wherein the movable member further comprises an operating portion having a first end connected to the pivoting portion and a second end connected to the jointing portion.

11. A heat sink, comprising:
  a one-piece body comprising at least one first slot and at least one second slot extending in parallel with the first slot, wherein the first and second slots are respectively formed at two opposite edges of the one-piece body; and
  at least a movable member pivotally coupled to the one-piece body and comprising:
    at least one pivoting portion received in the first slot;
    a plurality of fixing portions, each of the plurality of fixing portions comprising at least one connecting portion protruded from the movable member and connected to the pivoting portion, and at least one pressing portion connected to the connecting portion, wherein the pressing portions are configured to detachably secure two corners of a fan to one of said two opposite edges of the one-piece body; and
    a jointing portion disposed at one end of the movable member, wherein when the movable member secures the fan on the one-piece body, the jointing portion is received in the second slot for fixing the movable member and there is a step height between the pivoting portion and the pressing portion,
  wherein two movable members are provided to fix the fan on the heat sink so that four corners of the fan are secured to said two opposite edges of the one-piece body respectively by the pressing portions of two movable members.

12. The heat sink as claimed in claim 11, wherein the fixing portion abuts against a side surface, a corner or a base of the fan.

13. The heat sink as claimed in claim 11, wherein the connecting portion and the pressing portion with an angle formed therebetween.

14. The heat sink as claimed in claim 13, wherein the connecting portion is linear or curved, and the pressing portion is U-shaped, linear or curved.

15. The heat sink as claimed in claim 11, wherein the fixing portion is a C shaped structure, a U shaped structure, an L shaped structure, a K shaped structure or a J shaped structure, and the jointing portion is linear, L-shaped, U-shaped or curved, and the movable member is a shaft shaped structure, a plate-shaped structure, a cubic structure or an integrally formed structure.

16. The heat sink as claimed in claim 11, wherein the movable member further comprises a holding portion enabling a user to move the movable member.

17. The heat sink as claimed in claim 16, wherein the holding portion is a linear structure, a U-shaped structure, a N-shaped structure, a M-shaped structure, a curved structure, a plate shaped structure with at least one bend.

18. The heat sink as claimed in claim 11, wherein the one-piece body further comprises a plurality of fins, and the first slot and second slot are formed on the one-piece body as a single piece.

19. The heat sink as claimed in claim 11, wherein the one-piece body further comprises a plate portion receiving the fan, the first and second slots surrounding a periphery of the plate portion are disposed on the one-piece body.

20. The heat sink as claimed in claim 11, wherein the movable portion further comprises an operating portion having one end connected to the pivoting portion.

21. The heat dissipating module as claimed in claim 1, wherein when the movable member secures the fan on the one-piece body, there is a step height between the pivoting portion and the pressing portion.

* * * * *